United States Patent
Frye et al.

(10) Patent No.: US 7,277,159 B2
(45) Date of Patent: Oct. 2, 2007

(54) SYSTEM AND METHOD FOR AUTOMATICALLY MOUNTING A PELLICLE ASSEMBLY ON A PHOTOMASK

(75) Inventors: Ethan M. Frye, Westfield, IN (US); Kevin L. Griffin, Kokomo, IN (US); Bart A. Wiles, Kokomo, IN (US); Peter A. Hendrickson, Kokomo, IN (US); Jennifer M. Shepler, Newark, DE (US)

(73) Assignee: Toppan Photomasks, Inc., Round Rock, TX (US)

( * ) Notice: Subject to any disclaimer, the term of this patent is extended or adjusted under 35 U.S.C. 154(b) by 0 days.

(21) Appl. No.: 11/278,481

(22) Filed: Apr. 3, 2006

(65) Prior Publication Data

US 2006/0227314 A1    Oct. 12, 2006

Related U.S. Application Data

(63) Continuation of application No. PCT/US2004/032890, filed on Oct. 5, 2004.

(60) Provisional application No. 60/509,087, filed on Oct. 6, 2003.

(51) Int. Cl.
*G03B 27/62* (2006.01)
*G03B 27/32* (2006.01)

(52) U.S. Cl. .......................................... 355/75; 355/77

(58) Field of Classification Search .................. 355/75, 355/77; 73/862.045; 156/581, 580
See application file for complete search history.

(56) References Cited

U.S. PATENT DOCUMENTS

2002/0112824 A1* 8/2002 Ballard et al. ............... 156/581
2004/0194556 A1* 10/2004 Shu et al. .............. 73/862.045

OTHER PUBLICATIONS

International Search Report and Written Opinion of the International Searching Authority for Application No. PCT/US04/32890 (7 pages), Jul. 7, 2006.

* cited by examiner

*Primary Examiner*—Peter B. Kim
(74) *Attorney, Agent, or Firm*—Baker Botts L.L.P.

(57) ABSTRACT

A system and method for automatically mounting a pellicle assembly on a photomask are disclosed. The method includes loading a photomask into a mounting apparatus and loading a pellicle assembly into a back plate of the mounting apparatus opposite the photomask. The back plate includes at least one load cell that measures a force applied by the mounting apparatus to the photomask and the pellicle assembly. The measured force associated with the at least one load cell is received and the pellicle assembly is mounted on the photomask to create a photomask assembly if the measured force is greater than or approximately equal to a minimum force.

31 Claims, 3 Drawing Sheets

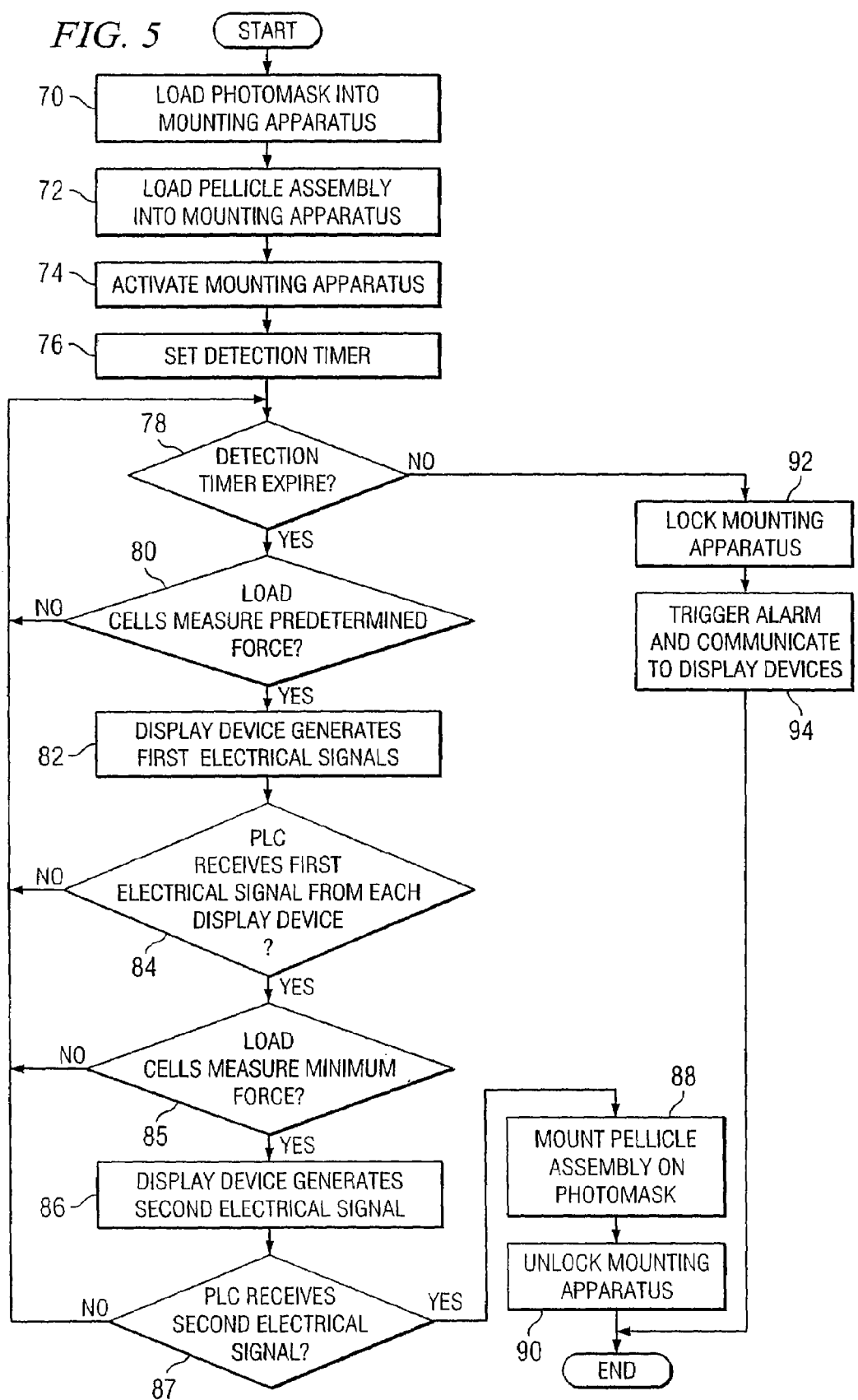

SYSTEM AND METHOD FOR AUTOMATICALLY MOUNTING A PELLICLE ASSEMBLY ON A PHOTOMASK

RELATED APPLICATION

This application is a Continuation of International Patent Application No. US/04/032890 filed Oct. 5, 2004, which designates the United States and claims the benefit of U.S. Provisional Patent Application Ser. No. 60/509,087 entitled "SYSTEM AND METHOD FOR AUTOMATICALLY MOUNTING A PELLICLE ASSEMBLY ON A PHOTOMASK" filed by Ethan M. Frye et al. on Oct. 6, 2003.

TECHNICAL FIELD OF THE INVENTION

The present invention relates in general to photomask manufacturing and, more particularly to a system and method for automatically mounting a pellicle assembly on a photomask.

BACKGROUND OF THE INVENTION

As semiconductor device manufacturers continue to produce smaller devices, the requirements for photomasks used in the fabrication of these devices continue to tighten. Photomasks, also known as reticles or masks, typically consist of substrates that have an absorber layer formed on the substrate. The absorber layer includes a pattern representing a circuit image that may be transferred onto semiconductor wafers in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

In order to maintain the quality of the photomask throughout its lifetime, manufacturers have developed a pellicle to protect at least the patterned side of the photomask from being damaged by contaminants that may be present in semiconductor manufacturing tools. The pellicle typically includes a thin film attached to a frame, which has a height that places the thin film outside of the focal plane such that contaminants on the film are not imaged onto a semiconductor wafer. The pellicle frame is typically mounted on the photomask with an annular shaped adhesive gasket that is attached to the bottom and around the perimeter of the pellicle frame.

Due to the opaque nature of the absorber layer, inspecting and controlling the adhesion of the pellicle to the photomask is a difficult task. Advances in pellicle to photomask adhesives have improved the capability of the pellicle mounting process. However, excursions from the normal protocol may not be detected, which can lead to contamination under the pellicle, damage to the membrane, or even damage to the photomask itself.

An accurate measurement of the forces being applied to the photomask is critically necessary to ensure proper adhesion of the pellicle and alert a manufacturer to potential non-conforming products. Furthermore, with the feature size on photomasks and silicon wafers ever decreasing in size, registration or overlay from one pattern layer to the next becomes of the utmost importance. Under some circumstances, the force distribution across the photomask during pellicle mounting can adjust the range of overlay distortion of the photomask by up to approximately thirteen nanometers (13 nm). With wafer fabrication specifications for layer to layer overlay nearing the twenty nanometer (20 nm) range, it is necessary to control the force distribution during the pellicle mounting process in order to prevent the pellicle mounting process from assuming over fifty percent (50%) of the error allowed in overlay measurement. Current industry standard pellicle application tools do not allow the measurement of the force distribution, making controlling, or even understanding the effect of, this force an impossibility.

Pellicle mounting tools currently allow only minor adjustment to the forces applied to the pellicle during the mounting process. Many mounting tools provide the ability to regulate overall, or absolute, force exerted on the pellicle/photomask assembly. However, this regulation is well below the capability needed to accurately monitor and control the force distribution required in the current and future photomask industry. Conventional pellicle mounting tools rely on either a pneumatically driven cylinder, which pushes two parallel fixtures together at even speed and force, or a mechanical drive shaft that moves the pellicle fixtures toward a stationary photomask. While the air cylinder provides a source for equal pressure on the front and back of the pellicle/photomask assembly, the location of the cylinder is well below the needed point of force. This arrangement may result in a radial and uneven distribution of the applied force from top to bottom of the pellicle/photomask assembly. Small variations in setup, fixturing, or milling of the pellicle mounting tool can amplify this uneven distribution, which may cause poor adhesion of the pellicle to the photomask. In current industry standard equipment, this failure cannot be detected without thorough manual inspection or comprehensive mechanical testing of the pellicle frame and adhesive.

SUMMARY OF THE INVENTION

In accordance with teachings of the present invention, disadvantages and problems associated with mounting a pellicle assembly on a photomask have been substantially reduced or eliminated. In a particular embodiment, at least one load cell embedded in a back plate of a mounting apparatus measures a force applied by the mounting apparatus and a pellicle assembly is mounted on a photomask if the measured force is greater than a minimum force.

In accordance with one embodiment of the present invention, a method for automatically mounting a pellicle assembly on a photomask includes loading a photomask into a mounting apparatus and loading a pellicle assembly into a back plate of the mounting apparatus opposite the photomask. The back plate includes at least one load cell that measures a force applied by the mounting apparatus to the photomask and the pellicle assembly. The measured force associated with the at least one load cell is received and the pellicle assembly is mounted on the photomask to create a photomask assembly if the measured force is greater than or approximately equal to a minimum force.

In accordance with another embodiment of the present invention, a system for mounting a pellicle assembly on a photomask includes a mounting apparatus having a back plate for holding a pellicle fixture that includes a pellicle assembly and a fixture mount for holding a photomask. At least one load cell that measures a force applied by the mounting apparatus on the photomask and pellicle assembly is disposed in the back plate.

In accordance with a further embodiment of the present invention, a system for mounting a pellicle assembly on a photomask includes a mounting apparatus having a back plate for holding a pellicle fixture that includes a pellicle assembly and a fixture mount for holding a photomask. A load cell is disposed at each corner of the back plate. Each load cell measures a force applied by the mounting apparatus on the photomask and the pellicle assembly.

Important technical advantages of certain embodiments of the present invention include a pellicle mounting technique that reduces or eliminates adhesion errors during a mounting process. During the mounting process, load cells located in a back plate of a mounting apparatus measure the force being applied to a photomask and a pellicle assembly by the mounting apparatus. If the applied force is greater than a minimum force, the load cells communicate electrical signals to a controller associated with the mounting apparatus. If the controller receives the electrical signals, the mounting process is completed and a conforming photomask assembly is generated. If the controller does not receive the electrical signals, the controller determines that a non-conforming photomask assembly has been formed and the controller prevents the non-conforming product from being removed by an operator of the mounting apparatus.

Another important technical advantage of certain embodiments of the present invention includes a pellicle mounting technique that provides the ability to accurately monitor and control the force distribution across a photomask and pellicle assembly in a mounting apparatus. The mounting apparatus includes a back plate containing multiple load cells. The load cells measure a force applied by the mounting apparatus at various locations on the pellicle assembly. By providing measurements from different locations, multiple values may be obtained for the total area of the pellicle assembly. The load cells, therefore, may determine if the force distribution across the pellicle assembly is even and may detect failures that cause poor adhesion of the pellicle assembly to the photomask.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein:

FIG. 5 illustrates a flow chart of a method for automatically mounting a pellicle assembly on a photomask according to teachings of the present invention.

DETAILED DESCRIPTION OF THE INVENTION

Preferred embodiments of the present invention and their advantages are best understood by reference to FIGS. 1 through 5, where like numbers are used to indicate like and corresponding parts.

Figure 1:
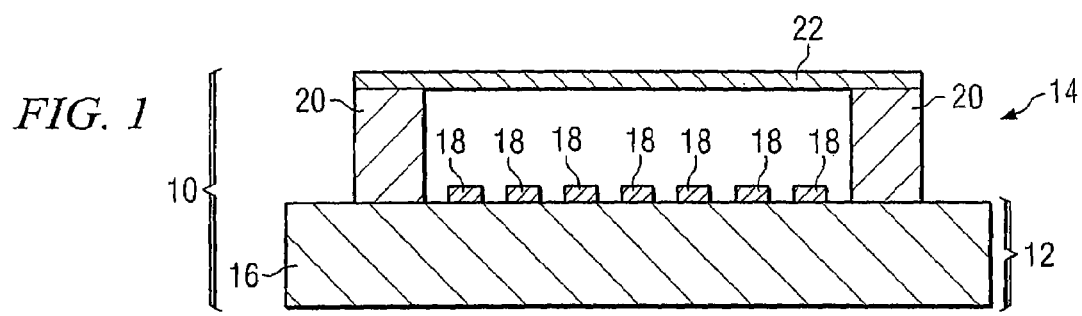
FIG. 1 illustrates a cross-sectional view of a photomask assembly according to teachings of the present invention.

FIG. 1 illustrates a cross-sectional view of photomask assembly 10 assembled in a pellicle mounting system. Photomask assembly 10 includes pellicle assembly 14 mounted on photomask 12 by the pellicle mounting system. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correaction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (e.g., MOCN, where M is selected from the group consisting of chromium, cobalt, iron, zinc, molybdenum, niobium, tantalum, titanium, tungsten, aluminum, magnesium, and silicon), or any other suitable material that absorbs electromagnetic energy with wavelengths in the ultraviolet (UV) range, deep ultraviolet (DUV) range, vacuum ultraviolet (VUV) range and/or extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12.

This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Before photomask assembly 10 is shipped to a semiconductor manufacturer, photomask assembly 10 may be assembled by placing photomask 12 and pellicle assembly 14 in a pellicle mounting system. The pellicle mounting system may include a mounting apparatus, one or more display devices and a controller. The mounting apparatus may include at least one pellicle fixture mount, which rests against a back plate, and a photomask fixture mount. Photomask 12 and pellicle assembly 14 may be automatically or manually loaded into their respective fixture mounts in the mounting apparatus.

In conventional pellicle mounting systems, the force may be unevenly distributed from top to bottom and side to side of the photomask assembly, which may damage the pellicle and/or photomask. As described in further detail below, the present invention provides a solution for determining if the pellicle was mounted on the photomask using uneven distribution of force. Multiple load cells that measure the force applied by the mounting apparatus may be embedded into a surface of the back plate in the mounting apparatus. In one embodiment, the back plate includes a load cell located at each of the corners. In another embodiment, the back plate includes a load cell located proximate to each edge. In either embodiment, a display device may be electronically interfaced with each of the load cells.

Each of the load cells may measure a force applied by the mounting apparatus to photomask 12 and pellicle assembly 14 and communicate the measured force to a corresponding display device. If the measured force is greater than a minimum force necessary to ensure proper adhesion, the display device generates an electrical signal that is communicated to the controller. If the controller receives an electrical signal associated with each one of the display devices corresponding to the four load cells, the controller continues the pellicle mounting process by instructing the mounting apparatus to apply at least the minimum force to photomask 12 and pellicle assembly 14 for at least a specific amount of time. Since each of the load cells measure the force applied to different points on pellicle assembly 14, the load cells may ensure that the force distribution across pellicle assembly 14 and photomask 12 during the mounting process is such that pellicle assembly 10 has the proper adhesion.

If the force as measured by a load cell at a particular location on pellicle assembly 14 is less than the minimum force, the display device corresponding to the load cell does not generate an electrical signal. If the controller does not receive electrical signals from each of the display devices before a timer expires, the controller locks the mounting apparatus and prevents photomask assembly 10 from being removed by the operator. The locked mounting apparatus may alert the operator that pellicle assembly 14 was not correctly mounted on photomask 12. In one embodiment, the display devices associated with each of the load cells may also visually and/or audibly trigger alarms indicating that pellicle assembly 14 was incorrectly mounted on photomask 12. In another embodiment, the load cells may communicate data to the corresponding display devices such that the force being applied to a particular load cell may be graphically display on the display devices. The data may additionally be communicated to the controller so that the data may be analyzed in order to improve the performance of the mounting apparatus.

Figure 2A:
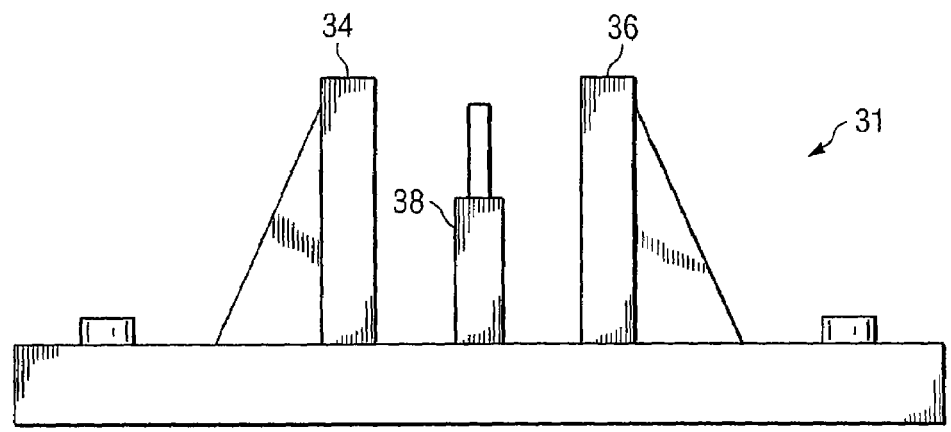
FIG. 2A illustrates a cross-sectional view of a pellicle mounting system according to teachings of the present invention.
Figure 2B:
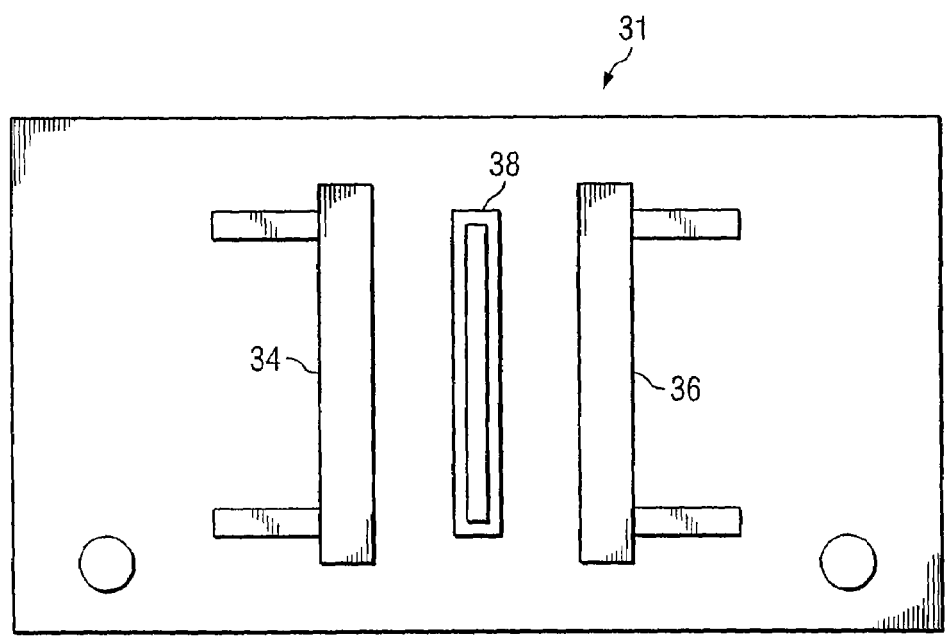
FIG. 2B illustrates a top view of a pellicle mounting system according to teachings of the present invention.

FIGS. 2A and 2B respectively illustrate a cross-sectional view and a top view of pellicle mounting system that may be used to mount pellicle assembly 14 on photomask 12. The pellicle mounting system may include mounting apparatus 31, display devices (not expressly shown) and a programmable logic controller (PLC) (not expressly shown). Mounting apparatus 31 may include first back plate 34, second back plate 36 and photomask fixture mount 38. A pellicle assembly may be placed in a pellicle fixture, which may then be placed on either or both of first and second back plates 34 and 36. In one embodiment, a drive mechanism (not expressly shown), such as a pneumatic press, a hydraulic press, or a mechanical drive shaft may be located between or behind either or both of first and second back plates 34 and 36 and may operate to move first back plate 34 and/or second back plate 36 toward photomask fixture mount 38. In one embodiment, the drive mechanism may be activated when the PLC directs voltage to a solenoid that allows air into a pneumatic or hydraulic press. In another embodiment, the drive mechanism may be activated when the PLC engages a motor in order to operate the mechanical drive shaft.

First and second back plates 34 and 36 may include multiple load cells embedded into a surface of each back plate. The load cells may measure a force applied to pellicle assembly 14 at different locations on pellicle assembly 14 during the mounting process and communicate the measured force to the corresponding display device. If the measured force is greater than a minimum force needed to properly mount pellicle assembly 14 on photomask 12, the corresponding display device may generate an electrical signal indicating that the proper amount of force was applied at the particular point on pellicle assembly 14. The display device may then communicate the electrical signal to the PLC. If the PLC receives an electrical signal associated with each of the display devices before a timer expires, the PLC may complete the mounting process and unlock mounting apparatus 31 so that the operator may remove photomask assembly 10. If the PLC does not receive an electrical signal from at least one of the display devices, the PLC may lock the mounting apparatus and alert the operator that less than the minimum amount of force was applied to at least one location on pellicle assembly 14 during the mounting process.

Figure 3:
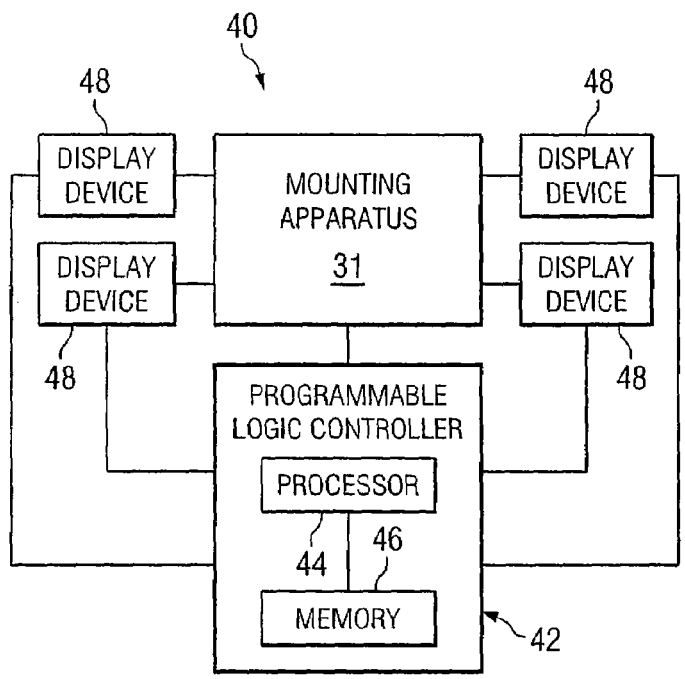
FIG. 3 illustrates a block diagram of a pellicle mounting system according to teachings of the present invention.

FIG. 3 illustrates a block diagram of pellicle mounting system 40. In the illustrated embodiment, mounting system 40 includes mounting apparatus 31, programmable logic controller (PLC) 42 and display devices 48. Mounting apparatus 31 may include load cells embedded into a back plate at one or more locations. The load cells may measure a force applied to photomask 12 and pellicle assembly 14 by mounting apparatus 31 during a pellicle mounting process and direct the measured forces to display devices 48. If display devices 48 determine that the applied force is greater than a minimum force, each of display devices 48 generates an electrical signal indicating that the applied force is sufficient to achieve proper adhesion between pellicle assembly 14 and photomask 12. The electrical signals associated with each of display devices 48 may be sent to PLC 42 in order to complete the mounting process.

If PLC 42 does not receive an electrical signal associated with each of display devices 48 within a predetermined amount of time, the proper amount of force was not applied by mounting apparatus 31 and PLC 42 locks mounting apparatus 31 to prevent the non-conforming photomask assembly from being removed by the operator. Display devices 48 may also trigger alarms based on the measured force from the load cells to notify the operator that the pellicle assembly was improperly mounted on the photomask.

In the illustrated embodiment, mounting apparatus 31, PLC 42 and display devices 48 are directly interfaced with each other. More specifically, the load cells included in the back plates of mounting apparatus 31 may be directly interfaced with display devices 48 and display devices 48 may be directly interfaced with PLC 42. In another embodiment, the individual devices in mounting system 40 may be interfaced with each other in a network. The network may be capable of transmitting telecommunication signals, data and/or messages and may include any suitable collection and arrangement of devices that support the transport and delivery of packets, cells, or other portions of information (generally referred to as packets). For example, the network may be one or a collection of components associated with the public switched telephone network (PSTN), a local area network (LAN), a wide area network (WAN), a global computer network such as the Internet, or any other communications equipment suitable for providing wireless and/or wireline communications.

PLC 42 may include processor 44 and memory 46. Processor 40 may be a microprocessor, a microcontroller, a digital signal processor (DSP) or any other digital or analog circuitry configured to execute processing instructions stored in memory 46. Memory 46 may be random access memory (RAM), electrically erasable programmable read-only memory (EEPROM), a PCMCIA card, flash memory, or any suitable selection and/or array of volatile or non-volatile memory. Display devices 48 may be liquid crystal devices, cathode ray tubes, or other display devices suitable for creating graphic images and alphanumeric characters recognizable to a user. Although display devices 48 are shown as communicating with mounting apparatus 31 and PLC 42 through a direct interface, display devices 48 may also communicate over a network. In another embodiment, display devices 48 may be integral to PLC 42.

In operation, processing instructions are stored in memory 46. Processor 44 accesses memory 46 to retrieve the processing instructions and perform various functions included in the processing instructions. In one embodiment, the processing instructions may include a mounting module. The mounting module may initiate the mounting process, determine if a minimum amount of force was applied to photomask 12 and pellicle assembly 14 within a predetermined amount of time and complete the mounting process if pellicle assembly 14 was properly mounted on photomask 12. In another embodiment, display devices 48 may be programmed to determine if the minimum amount of force was applied to photomask 12 and pellicle assembly 14 and communicate this information to PLC 42 for use by the mounting module.

In one embodiment, an operator may activate mounting apparatus 31 in order to initiate the mounting process once pellicle assembly 14 and photomask 12 have been loaded into mounting apparatus 31. The operator may press a button, turn a knob or use any other suitable technique to mechanically or electrically close a trigger switch that activates the drive mechanism of mounting apparatus 31. In one embodiment, the mounting module may receive a mounting signal in response to the operator initiating the mounting process and may instruct processor 44 to direct voltage to a solenoid that allows air to enter into a pneumatic or hydraulic press within mounting apparatus 31 to begin mounting pellicle assembly 14 on photomask 12.

When the operator activates mounting apparatus 31, the mounting signal may further be used to activate a detection timer. In one embodiment, the detection timer may be used by the mounting module to determine if the minimum amount of force was applied to photomask 12 and pellicle assembly 14 within a predetermined amount of time. For example, if the minimum force is detected by the load cells in the back plate before the detection timer expires, the mounting module completes the mounting process and unlocks mounting apparatus 31 such that photomask assembly 10 may be removed. Otherwise, if the load cells do not detect the minimum force before the detection timer expires, the mounting module locks mounting apparatus 31 and triggers an alarm that may be displayed by one or more of display devices 48 to notify the operator that pellicle assembly 14 was improperly mounted on photomask 12.

Once the mounting process begins, each of the load cells located on the back plate of mounting apparatus 31 may measure the force applied to photomask 12 and pellicle assembly 14. In one embodiment, the load cells may be continuously sending data to display devices 48 and the force being applied to each individual load cell may be displayed on display devices 48. If each of display devices 48 determines that the minimum amount of force needed to properly adhere pellicle assembly 14 to photomask 12 is being applied to the particular location associated with the load cell, display devices 48 generate an electrical signal and communicate the electrical signal to PLC 42.

In one embodiment, display devices 48 may generate a first electrical signal indicating that all pellicle assembly to photomask contacts have been achieved and a second electrical signal indicating that the minimum amount of force is being applied by mounting apparatus 31 at the particular locations. As described above, the mounting signal generated when the operator initiates the mounting process may start the detection timer. If the mounting module receives a first electrical signal generated by each of display devices 48 before the detection timer expires, the mounting module instructs processor 44 to continuing the mounting process. Otherwise, the mounting module may instruct processor 44 to terminate the mounting process. In one embodiment, the first electrical signal may be used as a safety measure to ensure that the operator does not attempt to remove photomask 12 and/or pellicle assembly 14 during the mounting process.

If the mounting module receives the second electrical signal before the detection timer expires, the mounting module activates a mounting timer, which represents the amount of time that at least the minimum force should be applied by mounting apparatus 31 in order to properly mount pellicle assembly 14 on photomask 12. In one embodiment, the second electrical signal may be generated by electrically coupling each of display devices 48 in series such that one of display devices 48 communicates a signal to another one of display devices 48 and the second electrical signal is generated by the final one of display devices 48 in the series only if all of the other display devices 48 generated a signal. If the mounting module receives the second signal, the mounting module may instruct processor 44 to continue the mounting process by applying a force approximately equal to or greater than the minimum force until the mounting timer expires.

If the mounting module does not receive either the first or second electrical signals, the mounting module terminates the mounting process and instructs processor 44 to lock mounting apparatus 31. By locking mounting apparatus 31, the operator cannot remove photomask assembly 10 and may be alerted that pellicle assembly 14 was improperly mounted on photomask 12. In one embodiment, the mounting module may generate an alarm to alert the operator that the mounting process was unsuccessful. The alarm may be audible or visual and displayed on display devices 48. In another embodiment, the alarms may be associated with the individual load cells such that, if visually displayed, may only be displayed on the corresponding display device.

In one embodiment, the programming instructions stored in memory 46 may further include a statistical process control (SPC) module. Measurements from the load cells, via an analog to digital electrical signal converter, may be transferred to the SPC module. Through the use of standard SPC rules, trending of pellicle mounting forces, minimum and maximum mounting forces, and non-conforming mounting forces may be documented and acted upon by equipment operators and engineers. This information may be used to design preventative maintenance protocol, as well as predict failures in the pellicle mounting process, allowing equipment engineers and operators to actively repair the pellicle mounting apparatus before non-conforming photomask assembly is created.

In other embodiments, the processing instructions for mounting a pellicle assembly on a photomask may be encoded in computer-usable media. Such computer-usable media may include, without limitation, storage media such as floppy disks, hard disks, CD-ROMs, DVDs, read-only memory, and random access memory; as well as communications media such wires, optical fibers, microwaves, radio waves, and other electromagnetic or optical carriers.

Figure 4C:
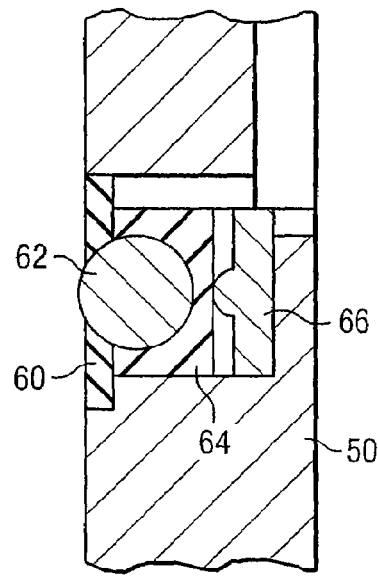
FIG. 4C illustrates a detailed cross-sectional view of the load cells shown in FIG. 4B.
Figure 4A:
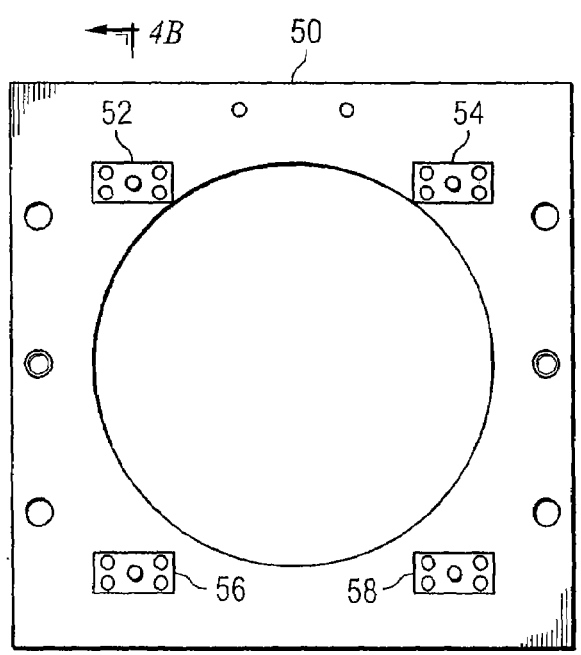
FIG. 4A illustrates a front view of a back plate including loading cells according to teachings of the present invention.

FIG. 4A illustrates a front view of back plates 34 and/or 36 (generally referred to as back plate 34) included in mounting apparatus 31. In the illustrated embodiment, back plate 34 includes load cells 52, 54, 56 and 58 (generally referred to as load cells 52) that measure the force applied to photomask 12 and pellicle assembly 14 by mounting apparatus 31. Although a specific number of load cells 52 are illustrated, greater than or fewer than four load cells may be incorporated into back plate 34.

Figure 4B:
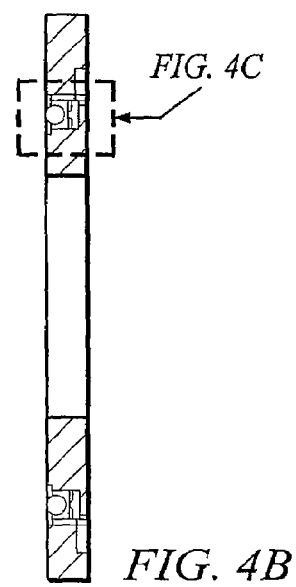
FIG. 4B illustrates a side cross-sectional view through line 4B of the back plate shown in FIG. 4A.

In one embodiment, as illustrated in FIG. 4B, load cells 52 may be embedded into a surface of back plate 50 such that at least a portion of load cells 52 is located below the surface. A shaft may be drilled into back plate 34 and each of load cells 52 may be located in a corresponding shaft such that a portion of load cells 52 is in contact with the wall of back plate 34.

In operation, load cells 52 measure a force exerted on photomask 12 and pellicle assembly 14 by mounting apparatus 31 in order to provide a top to bottom, side to side, and corner to corner force distribution profile.

In one embodiment, load cells 52 may be electrically coupled to a programmable logic controller (PLC) and display devices (e.g., PLC 42 and display devices 48 as shown in FIG. 3) that allow triggers or alarms to be set for specific force measurements. The triggers may then be used to control the mounting process. Although the triggers are described below as being received in a particular order, the triggers may be received simultaneously or sequentially in any order.

A first trigger may be used to determine if various locations on pellicle assembly 14 are in contact with corresponding locations on photomask 12 before a mounting timer is initiated. In one embodiment, load cells 52 measure a force applied to pellicle assembly 14 and photomask 12 in mounting apparatus 31 and communicate the measured force to display devices 48. If display devices 48 determine that the measured force is greater than a predetermined force, display devices 48 may generate a first electrical signal and communicate the first electrical signal to PLC 42. The predetermined force may be greater than zero but less than the minimum force necessary to mount pellicle assembly 14 on photomask 12. When PLC 42 receives four electrical signals, one from each of display devices 48, before a detection timer expires, PLC 42 holds the pellicle and photomask fixture mounts closed in order to mount pellicle assembly 14 on photomask 12. The individual signals received from display devices 48 may be used to ensure that the necessary pellicle to photomask contact points are achieved before the mounting timer is initiated.

If display devices 48 determine that the measured force from load cells 52 is not greater than the predetermined force, display devices 48 do not communicate a first electrical signal to PLC 42. If PLC 42 does not receive all of the first electrical signals before the detection timer expires, PLC 42 generates an alarm indicating that pellicle assembly 14 did not properly contact photomask 12. For example, the force measured by load cells 52 and 54 may be greater than the predetermined force and the corresponding display devices 48 may generate first electrical signals, which indicates that pellicle assembly 14 and photomask 12 are in contact in the locations corresponding to load cells 52 and 54. The force measured by load cells 56 and 58, however, may be less than the predetermined force, which indicates that pellicle assembly 14 and photomask 12 are not properly contacting each other in the locations corresponding to load cells 56 and 58. In this example, PLC 42 may receive two electrical signals before the detection timer expires. Since all four signals were not received, PLC 42 may generate an alarm.

A second trigger may be used to ensure that photomask 12 and pellicle assembly 14 receive the appropriate force for a specific amount of time. The second trigger may be generated by wiring each of display devices 48 in series. When display devices 48 determine that the measured force communicated by the corresponding load cells 52 is greater than a minimum force, each of display devices 48 may generate a signal. The signal may be communicated from one display device to the next as each of display devices 48 receives the measured force from load cells 52 and determines that the measured force is greater than the minimum force. For example, display device 48 interfaced with load cell 52 may detect the minimum force and communicate a signal to display device 48 interfaced with load cell 54. When display device 48 interfaced with load cell 54 detects the minimum force, a signal is then communicated to display device 48 interfaced with load cell 56. In this example, display device 48 interfaced with load cell 58 will only generate the second electrical signal when display device 48 interfaced with load cell 58 receives a signal from display device 48 interfaced with load cell 56 and receives a measured force from load cell 58 that is greater than the minimum force. If PLC 42 receives the second electrical signal from display device 48 interfaced with load cell 58, PLC 42 initiates the mounting timer and pellicle assembly 14 is mounted on photomask 12 with the necessary amount of force. When the mounting timer expires, PLC 42 unlocks mounting apparatus 31 and photomask assembly 10 may be removed.

If the forces measured by load cells 52 are less than the minimum force, display devices 48 do not communicate a signal between devices. For example, the force measured by load cell 54 may be less than the minimum force such that display device 48 interfaced with load cell 54 does not communicate a signal to another display device. The final one of display devices 48 in the series, therefore, will not generate the second electrical signal. If PLC 42 does not receive the second electrical signal, for example from display device 48 interfaced with load cell 58, before the detection timer expires, PLC 42 generates an alarm indicating that the minimum amount of force was not applied to each of load cells 52. In one embodiment, load cells 52 may be communicating data to display devices 48 and the force applied at any given time during the mounting process may be displayed on display devices 48. Again, the information displayed on display devices 48 may be used to determine how to correct the uneven force distribution.

FIG. 4C illustrates an expanded cross-sectional view of load cells 52. In the illustrated embodiment, load cells 52 include face plate 60, ball bearing 62, cylinder 64, and load sensor 66. Load sensor 66 may be placed in a shaft created in back plate 34 such that load sensor 66 contacts back plate 34 in the shaft. Cylinder 64 may be placed on top of load sensor 66 such that the center of load sensor 66 is in line with the center of cylinder 64. Ball bearing 62 may be placed inside cylinder 64 such that a small portion of ball bearing 62 is located above a surface of back plate 34. By allowing a portion of ball bearing 62 to remain above the surface of back plate 34, the pellicle and photomask fixture mounts of mounting apparatus 31 may be used without damaging load sensor 66. Face plate 60 may contain all parts of load cells 52 in back plate 34. Furthermore, since all force is applied to a single tangential point on ball bearing 62, all forces exerted on photomask 12 and pellicle assembly 14 may be measured with no loss due to surface area interactions.

FIG. 7 illustrates a flow chart of a method for automatically mounting a pellicle assembly on a photomask. Generally, an operator may initiate a mounting process. Load cells incorporated in a mounting apparatus may measure the force being applied to a pellicle assembly and a photomask loaded into the mounting apparatus and communicate the measured force to corresponding display devices. If the display devices determine that the mounting apparatus is applying a minimum force, electrical signals associated with the load cells may be communicated to a PLC. If the PLC receives the electrical signals before a detection timer expires, the PLC completes the mounting process and the photomask assembly my be removed from the mounting apparatus. If the PLC does not receives the electrical signals before the detection timer expires, the PLC locks the mounting apparatus so that the operator cannot remove the photomask assembly. Additionally, the PLC may generate alarms notifying the operator that the pellicle assembly was improperly mounted on the photomask.

At step 70, photomask 12 may be loaded into mounting apparatus 31. In one embodiment, photomask 12 may be automatically loaded into mounting apparatus 31 by a loading system activated by an operator. In another embodiment, the operator may manually load photomask 12 into mounting apparatus 31. After photomask 12 has been loaded into mounting apparatus 31, at least one pellicle assembly 14 may be loaded into first and/or second back plates 34 and 36 at step 72. Pellicle assembly 14 may be loaded automatically by a loading system activated by the operator or placed in mounting apparatus 31 manually by the operator.

At step 74, the operator may activate mounting apparatus 31. In one embodiment, the operator may close a trigger switch that activates mounting apparatus 31. In another embodiment, the operator may invoke a mounting module stored in memory 46 of PLC 42. PLC 42 may execute the mounting module by sending a signal to mounting apparatus 31 that instructs the drive mechanism of mounting apparatus 31 to move pellicle holder and photomask holder towards one another.

At step 76, the mounting module may initiate a detection timer. The detection timer may be used by PLC 42 to determine if the minimum force was applied by mounting apparatus 31 within a predetermined amount of time. The mounting module then determines if the detection timer has expired at step 78. If the detection timer has not expired, the mounting module determines if the forces measured by load cells 52 are greater than a predetermined force at step 80. In one embodiment, the minimum force may be any force (e.g., approximately one pound) that indicates that pellicle assembly 14 is properly contacting photomask 12. If the mounting module determines that load cells 52 have not measured a force greater than the predetermined force, the mounting module returns to step 78 to determine if the detection timer has expired.

If at least one of load cells 52 has measured the predetermined force, the corresponding display device interfaced with the load cell generates a first electrical signal at step 82. In one embodiment, the first electrical signal may indicate that pellicle assembly 14 is in contact with photomask 12 at a particular location associated with the load cell interfaced with the display device. The first electrical signals may be generated by each of display devices 48. At step 84, the mounting module determines if all of the first electrical signals associated with load cells 52 have been received by PLC 42. If all of the first electrical signals have not been received, the mounting module determines if the detection timer has expired at step 78.

If PLC 42 has received all of the first electrical signals, the mounting module determines if the forces measured by load cells 52 are greater than a minimum force at step 85. In one embodiment, the minimum force may be any force which, when applied for a specific amount of time, will provide the sufficient amount of adhesion to mount pellicle assembly 14 on photomask 12. If the mounting module determines that load cells 52 have not measured a force greater than the minimum force, the mounting module returns to step 78 to determine if the detection timer has expired.

If all of load cells 52 have measured the minimum force, one of display devices 48 interfaced with load cells 52 generates a second electrical signal at step 86. In one embodiment, the second electrical signal may indicate that the minimum amount of force needed to properly mount pellicle assembly 14 on photomask 12 is being applied by mounting apparatus at the points of pellicle assembly 14 corresponding to the locations of load cells 52 in back plate 34. At step 87, the mounting module determines if PLC 42 has received the second electrical signal from the appropriate one of display devices 48. If PLC 42 has not received the second electrical signal, the mounting module determines if the detection timer has expired at step 78.

If PLC 42 has received the second electrical signal, the mounting module instructs processor 44 to continue the mounting process at step 88. The mounting module may simultaneously set a mounting timer upon receiving the second signal, which may be used to set the time for applying at least the minimum force to properly mount pellicle assembly 14 on photomask 12. In one embodiment, the mounting timer may have a duration of approximately fifteen seconds (15 sec). In other embodiments, the mounting timer may have any duration that allows pellicle assembly 14 to be properly mounted on photomask 12. Once the force has been applied for the set amount of time, the mounting module may unlock mounting apparatus 31 at step 90. The operator may then remove photomask assembly 10 from mounting apparatus 31.

If, however, the mounting module determines that the detection timer has expired before PLC 42 receives the first and second signals from display devices 48, the mounting module locks mounting apparatus 31 such that photomask assembly 10 cannot be removed by the operator at step 92. The mounting module further triggers alarms that may notify the operator of the error at step 94. In one embodiment, the alarms may be audible and may be generated by speakers associated with display devices 48. In another embodiment, the alarms may be visible and may be displayed by display devices 48. The alarms may be associated with mounting apparatus 31 as a whole or the alarms may be associated with the specific load cell that detected the error.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for mounting a pellicle assembly on a photomask, comprising:
   loading a photomask into a mounting apparatus;
   loading a pellicle assembly into a back plate of the mounting apparatus opposite the photomask, the back plate including at least one load cell operable to measure a force applied by the mounting apparatus to the photomask and the pellicle assembly;
   receiving the measured force associated with the at least one load cell; and
   mounting the pellicle assembly on the photomask to create a photomask assembly if the measured force is greater than or approximately equal to a minimum force receiving the measured force associated with the at least one load cell.

2. The method of claim 1, further comprising detecting a signal generated by a display device interfaced with the at least one load cell if the measured force is greater than or approximately equal to the minimum force.

3. The method of claim 1, further comprising locking the mounting apparatus to prevent the photomask assembly from being removed if the measured force is less than the minimum force.

4. The method of claim 1, further comprising displaying the measured force on a display device interfaced with the at least one load cell.

5. The method of claim 1, further comprising:
   activating a timer before receiving the measured force associated with the at least one load cell; and
   mounting the pellicle assembly on the photomask to create the photomask assembly if the measured force is greater than or approximately equal to the minimum force before the timer expires.

6. The method of claim 1, further comprising unlocking the mounting apparatus to allow the photomask assembly to be removed from the mounting apparatus.

7. The method of claim 1, wherein the back plate comprises the load cell disposed proximate each corner of the back plate.

8. The method of claim 7, further comprising:
   receiving the measured force associated with each of the load cells; and
   mounting the pellicle assembly on the photomask to create the photomask assembly if each of the measured forces are greater than or approximately equal to the minimum force.

9. The method of claim 8, further comprising detecting a first signal from a display device interfaced with each of the load cells if the measured force is greater than a predetermined force, the first signals operable to indicate that the pellicle assembly is in proper contact with the photomask.

10. The method of claim 9, further comprising detecting a second signal from one of the display devices interfaced with the load cells if the mounting apparatus applies at least the minimum force to the photomask and the pellicle assembly, the display devices electrically coupled in series.

11. The method of claim 8, further comprising:
   detecting a first signal from a display device interfaced with each of the load cells if the measured force is greater than a predetermined force, the first signals operable to indicate that the pellicle assembly is in proper contact with the photomask; and
   detecting a second signal from one of the display devices interfaced with the load cells if the measured force associated with each of the load cells is greater than or approximately equal to the minimum force.

12. The method of claim 11, further comprising:
   activating a first timer before receiving the measured force from the at least one load cell;
   activating a second timer if the first and second signals are detected before the first timer expires; and
   applying at least the minimum force to the pellicle assembly and the photomask until the second timer expires.

13. A system for mounting a pellicle assembly on a photomask, comprising:
   a mounting apparatus including:
      a back plate operable to hold a pellicle fixture including a pellicle assembly; and
      a fixture mount operable to hold a photomask; and
   at least one load cell disposed in the back plate, the at least one load cell operable to measure a force applied by the mounting apparatus on the photomask and the pellicle assembly.

14. The system of claim 13, further comprising a programmable logic controller (PLC) interfaced with the mounting apparatus, the PLC operable to activate a drive mechanism to move the back plate such that the pellicle assembly is mounted on the photomask.

15. The system of claim 14, further comprising a display device electrically interfaced with the at least one load cell, the display device operable to generate a signal indicating that the measured force is greater than or approximately equal to a minimum force.

16. The system of claim 15, further comprising the display device operable to display the measured force associated with the at least one load cell.

17. The system of claim 15, further comprising the PLC operable to mount the pellicle assembly on the photomask if the PLC receives the signal generated by the display device.

18. The system of claim 15, further comprising the PLC operable to:
   activate a timer; and
   generate an alarm if the PLC does not receive the signal from the display device before the timer expires.

19. The system of claim 15, further comprising:
   the at least one load cell operable to continuously communicate the measured force to the display device;
   the display device operable to continuously communicate the measured force to the PLC; and
   the PLC including a statistical process control module operable to analyze the measured forces received from the display device.

20. The system of claim 13, wherein the load cell comprises:
   a load sensor disposed in a shaft formed in the back plate;
   a cylinder disposed in the shaft adjacent to the load sensor; and
   a ball bearing located in the cylinder such that at least a portion of the ball bearing is located above a surface of the back plate.

21. The system of claim 13, further comprising:
   the load cell disposed proximate each corner of the back plate; and
   a display device electrically interfaced with each of the load cells, each display device operable to receive the measured force from the corresponding load cell.

22. The system of claim 21, further comprising the display devices operable to:
   generate a first signal operable to indicate that the pellicle assembly is in proper contact with the photomask; and
   generate a second signal operable to indicate that the measured force is greater than or approximately equal to a minimum force.

23. A system for mounting a pellicle assembly on a photomask, comprising:
   a mounting apparatus including:
      a back plate operable to hold a pellicle fixture including a pellicle assembly; and
      a fixture mount operable to hold a photomask; and
   a load cell disposed at each corner of the back plate, the load cells operable to measure a force applied by the mounting apparatus on the photomask and the pellicle assembly.

24. The system of claim 23, further comprising the load cells operable to identify distribution of forces across the photomask during a mounting process.

25. The system of claim 23, further comprising a display device electrically interfaced with each of the load cells, the display device operable to:
   receive the measured force from the corresponding load cell; and
   generate a signal if the measured force is greater than or approximately equal to a minimum force.

26. The system of claim 25, further comprising a programmable logic controller (PLC) interfaced with each of the load cells, the PLC operable to:
   receive the signal generated by the each of the display devices; and
   mount the pellicle assembly on the photomask based on the signal.

27. The system of claim 26, further comprising the PLC operable to:
   activate a timer; and
   generate an alarm if the PLC does not receive the signals from each of the display devices before the timer expires.

28. The system of claim 26, further comprising:
   the load cells operable to continuously communicate the measured force to the display devices;
   the display devices operable to continuously communicate the measured force to the PLC; and
   the PLC including a statistical process control module operable to analyze the measured forces received from the load cells.

29. The system of claim 26, further comprising the display devices connected in series such that the PLC receives the signal from one of the display devices.

30. The system of claim 26, further comprising the display devices operable to:
   generate a first signal operable to indicate that the pellicle assembly is in proper contact with the photomask; and
   generate a second signal operable to indicate that the measured force is greater than or approximately equal to a minimum force.

31. The system of claim 30, further comprising the PLC operable to:
   activate a first timer;
   activate a second timer if the first and second signals are received by the PLC before the first timer expires; and
   apply at least the minimum force to the pellicle assembly and the photomask until the second timer expires.

* * * * *